United States Patent [19]
Sata

[11] Patent Number: 4,714,900
[45] Date of Patent: Dec. 22, 1987

[54] CURRENT OUTPUT CIRCUIT HAVING WELL-BALANCED OUTPUT CURRENTS OF OPPOSITE POLARITIES

[75] Inventor: Hiroshi Sata, Tokyo, Japan

[73] Assignee: NEC Corporation, Tokyo, Japan

[21] Appl. No.: 933,511

[22] Filed: Nov. 21, 1986

[30] Foreign Application Priority Data

Nov. 21, 1985 [JP] Japan .................................. 60-262805

[51] Int. Cl.$^4$ .............................................. H03L 7/00
[52] U.S. Cl. .......................................... 331/8; 331/17; 331/25
[58] Field of Search ................ 331/8, 17, 25; 328/133, 328/134, 155; 307/514, 525

[56] References Cited

U.S. PATENT DOCUMENTS 3,714,463 1/1973 Laune .............................. 328/134 X
4,649,353 3/1987 Sonnenberg ............................ 331/8

FOREIGN PATENT DOCUMENTS 0030422 2/1982 Japan ..................................... 331/17

Primary Examiner—Eugene R. Laroche
Assistant Examiner—Robert J. Pascal

Attorney, Agent, or Firm—Sughrue, Mion, Zinn, Macpeak & Seas

[57] ABSTRACT

A bipolar transistor circuit is disclosed, which receives input voltage signals and outputs a current of a polarity in accordance with the input signals and of a predetermined amplitude. This circuit includes a first current source producing a first reference current, an output terminal, bipolar switching transistors coupled between the first current source and the output terminal and controlled by the input voltage signals to supply to the output terminal an output current of a first polarity which has an amplitude of the first reference current minus a base current of the switching transistor or integer times of that amplitude, a current producing circuit producing a current that is substantially equal to the base current of the switching transistor, and a second current source connected to the output terminal and producing a second reference current of a second polarity which has an amplitude of the first reference current minus the amplitude of the current produced by the current producing circuit. The present invention thus provides a well-balanced output current which is suitable to charge and discharge a load capacitor with the same amount of charges.

10 Claims, 6 Drawing Figures

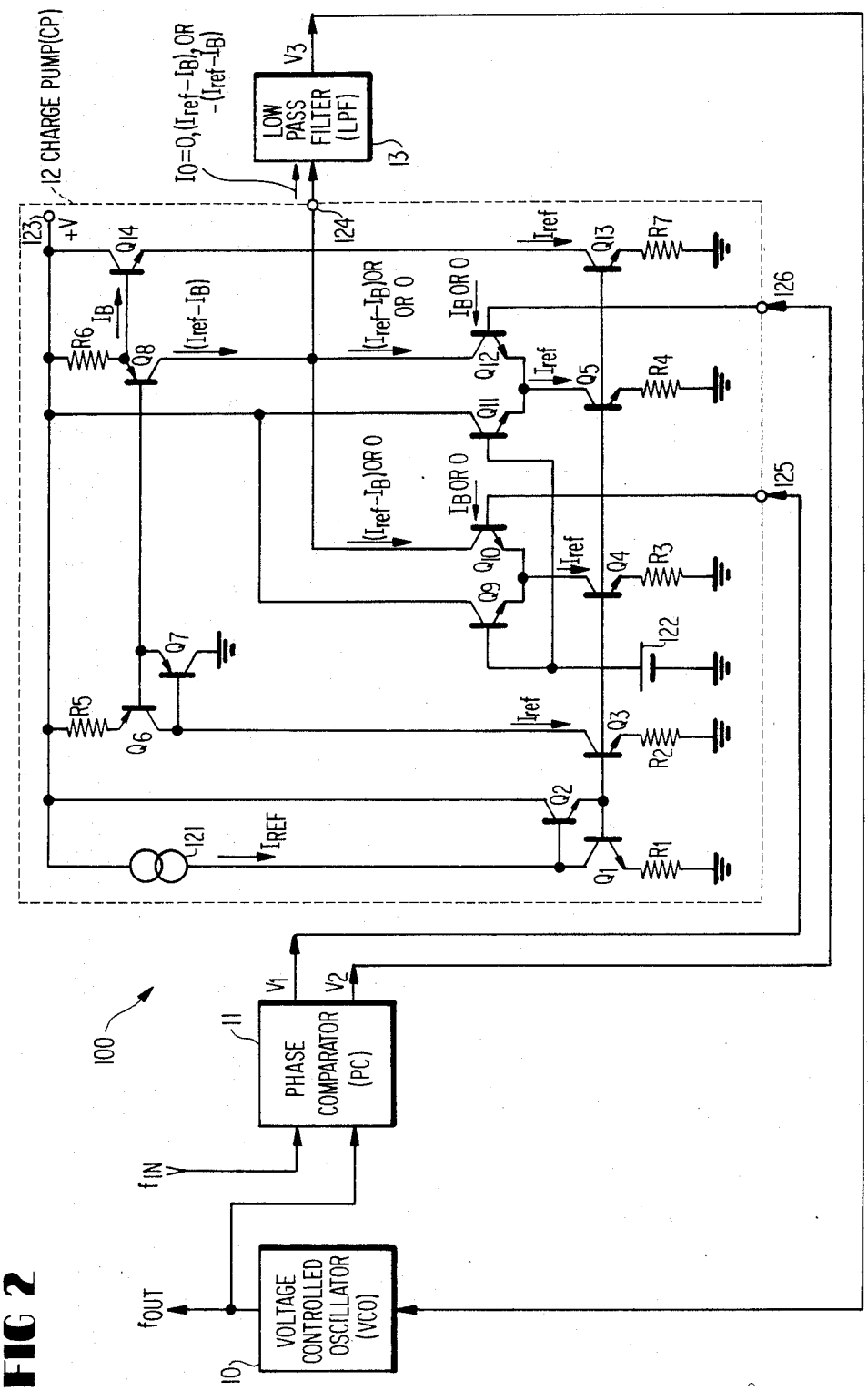

CURRENT OUTPUT CIRCUIT HAVING WELL-BALANCED OUTPUT CURRENTS OF OPPOSITE POLARITIES

BACKGROUND OF THE INVENTION

The present invention relates to a current output circuit, and more particularly, to a bipolar transistor circuit which outputs a current of a polarity determined by input signals.

Such a circuit is employed as a charging/discharging control circuit of a load capacitor, for example. More specifically, when input signals take a first combination of voltage levels, the circuit outputs a current of one polarity which, for example, charges the load capacitor, and when the input signals take a second combination, the circuit outputs a current of the opposite polarity having the same amplitude which, for example, discharges the load capacitor.

According to prior art, such a circuit includes first, second and third current sources and first and second switches. The first current source is connected between one of power terminals and an output terminal to which a load is connected. The first switch and the second current source are connected in series between the output terminal and the other power terminal, and the second switch and the third current source are also connected in series therebetween. Each of the first to third current sources produces a reference current of the same value, and first and second switches are controlled by input signals, respectively.

When the input signals take the first combination of voltage levels, the first and second switches are turned OFF. Accordingly, the current produced by the first current source is supplied to the output terminal as a positive current. When the input signals take the second combination of voltage levels, both of the first and second switches are turned ON. At this time, the current of the first current source is counteracted by that of the second current source, so that the current of the third current source is supplied to the output terminal as a negative current. When the input signals take the third combination of levels, only one of the first and second switches is turned ON. The current of the first current source is counteracted by the current of second or third current source and the output terminal is supplied with no current.

For a high speed operation, each of the switches is favorably composed of a bipolar transistor. The bipolar transistor requires a base current to take a conductive state, and hence its collector and emitter currents are different from each other. For this reason, the current of the first current source is not counteracted completely. Assuming that the value of the current of each current source is I and the value of the base current $I_B$, the positive output current has an amplitude of I and the negative output current has an amplitude of $(I-2I_B)$. When only one of the first and second switches is turned ON, the output terminal is supplied with a small current having an amplitude of $I_B$.

Thus, the prior art circuit has unbalanced output currents of opposite polarities.

SUMMARY OF THE INVENTION

Therefore, an object of the present invention is to provide a transistor circuit having well-balanced output currents.

Another object of the present invention is to provide a current output bipolar circuit in which affection of the base current is avoided.

A current output circuit according to the present invention comprising a plurality of input terminals receiving a plurality of input voltage signals, respectively, a reference current source generating a reference current, a plurality of first current-producing means coupled to the reference current source each for producing a first current having a first amplitude, an output terminal outputting an output current of a polarity determined by the input voltage signals, a plurality of switching means coupled between the first current-producing means and the output terminal, respectively, and having control terminals coupled to the input terminals, respectively, for switching paths of the first current therebetween in response to the input voltage signals at their control terminals, respectively, to supply to the output terminal an output current of a first polarity having one or more integer times of an amplitude which is the first amplitude of the first current minus a second amplitude of a current spended by one of the switching means, a second currentproducing means coupled to the reference current source for producing a second current having the first amplitude, a third current-producing means coupled to the reference current source for producing a third current having the second amplitude, and means coupled to the second and third current-producing means and to the output terminal for substracting the third current from the second current to supply to the output terminal an output current of a second polarity having an amplitude which is the first amplitude of the second current minus the second amplitude of the third current.

When all the switching means is made OFF not to provide any current path between the output terminal and the first current producing means, the output terminal outputs a current of one polarity from the subtracting means. The output current has an amplitude of the first amplitude minus the second amplitude. When any one of the switching means is made ON to provide a single current path of the first current to the output terminal, a current having an amplitude of the first amplitude minus the second amplitude is to flow. Since this amplitude is equal to that of the current from the subtracting means, the output terminal is supplied with substantially no current. When two of the switching means is switched ON to provide two current paths of the first current, the output terminal outputs a current of the opposite polarity and having the same amplitude (of the first amplitude minus the second amplitude) as that of the output current of the one polarity in the first case. If three or more of the first current-producing means and the switching means are respectively provided, the output current of the opposite polarity can have an amplitude of twice or more integer times of that of the output current of the one polarity by making three or more switching means ON.

Thus, the circuit according to the present invention has well-balanced output current characteristics. Moreover, it is possible to make the output current zero.

BRIEF DESCRIPTION OF THE DRAWINGS

The above and other objects, advantages and features of the present invention will be more apparent from the following description taken in conjunction with the accompanying drawings, in which

FIG. 2 is a circuit diagram showing a phase locked oscillator employing as a charge pump circuit a circuit according to another embodiment of the present invention;

DETAILED DESCRIPTION OF THE EMBODIMENTS

Figure 1:
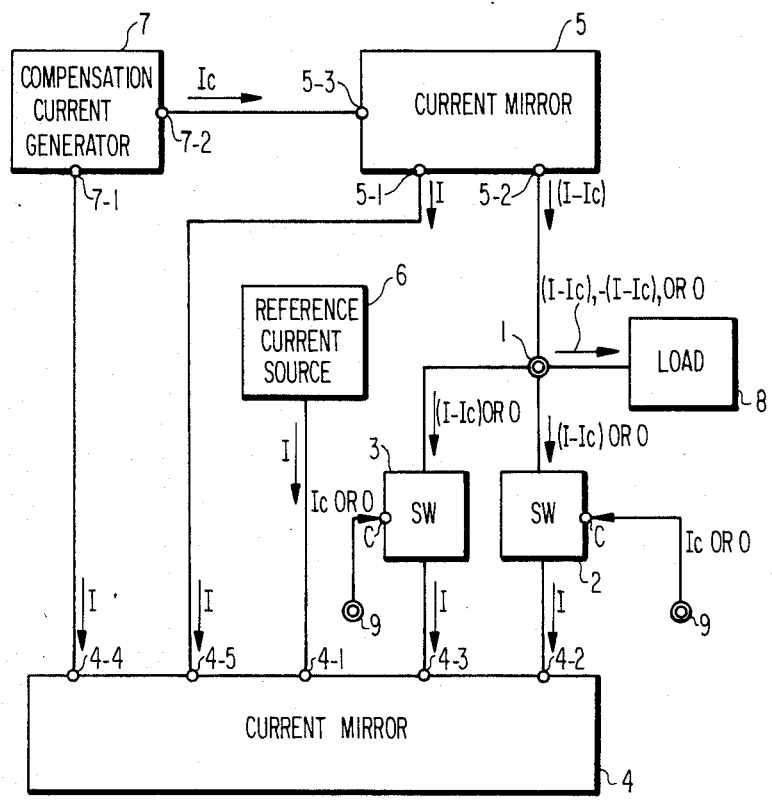
FIG. 1 is a block diagram showing an embodiment of the prevent invention.

With reference to FIG. 1, an embodiment of the present invention is shown in a block form. The circuit according to this embodiment includes an output terminal 1 connected to a load circuit 8, two switch circuits 2 and 3, two current mirror circuits 4 and 5, a reference current generator 6, a compensation current generator 7, and input terminals 9. The reference current source 6 generating a reference current I. The current mirror circuit 4 responds to the reference current I supplied to its input end 4-1 and produces at its four output ends 4-2 to 4-5 output currents having the substantially same value. In this embodiment, the output currents at the output ends 4-2 to 4-5 are substantially equal to the reference current I, and therefore denoted by "I", respectively. If desired, the output currents may be different from the reference current I. The first switch circuit 2 is connected between the output terminal 1 and the first output end 4-2, and the second switch circuit 3 is connected between the output terminal 1 and the second output end 4-3. Each of the switch circuits 2 and 3 has a control terminal C connected to each input terminal 9, and is turned ON when such an input voltage is applied to the input terminal 9 that makes a switching current $I_C$ follow through the control terminal C. The switching current $I_C$ flows into the output end of the current mirror 4 as a part of the output current I. Therefore, each of the switch circuits 2 and 3 draws from the output terminal 1 a current having a value of $(I-I_C)$ when turned ON. When the switches 2 and 3 are in an OFF state, they produces no current.

The output current at the third output end 4-4 of the current mirror 4 is supplied to an input end 7-1 of the compensation current generator 7 which produces a compensation current at its output end 7-2. The compensation current has a value that is substantially equal to that of the switching current $I_C$, and is thus denoted by "$I_C$". The fourth output end 4-5 of the current mirror 4 and the output end 7-2 of the current generator 7 are connected respectively to an input end 5-1 and a control end 5-3 of a second current circuit 5 which produces an output current at its output end 5-2 in response to the currents I and $I_C$. The output current at the output end 5-2 takes a value of $(I-I_C)$ as shown in FIG. 1 and is supplied to the output terminal 1 via a conductive path provided between the output end 5-2 and the output terminal 1.

When the switching current $I_C$ is not supplied to both of the switches 2 and 3 to turn them OFF, the output terminal 1 is disconnected from the output ends 4-2 and 4-3 of the current mirror 4. The current $(I-I_C)$ at the output end 5-2 of the current mirror 5 is thereby supplied through the output terminal 1 to the load 8. When the switches 2 and 3 are supplied with the switching current $I_C$, they provide current paths between the output terminal 1 and the output ends 4-2 and 4-3 to draw the current of $(I-I_C)$, respectively. The current drawn by the switch 2 is substantially equal to the current supplied from the current mirror 5. Therefore, the switch 3 draws the current of $(I-I_C)$ from the load 8 via the output terminal 1. In other words, the load circuit 8 is supplied with $-(I-I_C)$ current. When only one of the switches 2 and 3 receives the switching current I, substantially all current drawn by the turned-ON switch is supplied only from the current mirror 5. The load 8 is thereby supplied with no current to be disconnected from the output terminal 1 with respect to current.

Thus, the load circuit 8 is supplied with a current of $(I-I_C)$, $-(I-I_C)$, or 0 (zero) in accordance with ON/OFF states of the switches 2 and 3.

With reference to FIG. 2, a phase locked oscillator 100 is shown, in which the circuit 12 according to another embodiment of the present invention is used as a charge pump circuit (called hereinafter "CP"). A voltage controlled oscillator (VCO) 10 as a frequency variable oscillator generates an oscillation signal $f_{OUT}$ which is in turn supplied to a first input terminal of a phase comparator (PC) 11. The PC 11 also has a second input terminal supplied with an input signal $f_{IN}$ and compares the phases between the signals $f_{IN}$ and $f_{OUT}$ to produce phase comparison outputs $V_1$ and $V_2$. The CP 12 responds to the comparison outputs $V_1$ and $V_2$ and charges, discharges or disconnects a low-pass filter (LPF) 13. The output $V_3$ of the LPF 13 is fed back to the VCO 10. The frequency of the oscillation signal $f_{OUT}$ is thereby controlled so that the phase thereof is locked to that of the input signal $f_{IN}$.

In the CP 12, the comparison outputs $V_1$ and $V_2$ derived from the PC 11 are supplied respectively through input terminals 125 and 126 to the bases of NPN transistors $Q_{10}$ and $Q_{12}$ whose collectors are connected in common to an output terminal 124. The transistors $Q_{10}$ and $Q_{12}$ cooperate respectively with NPN transistors $Q_9$ and $Q_{11}$ to constitute a differential circuit. The common emitter connection of the transistors $Q_9$ and $Q_{10}$ and that of the transistors $Q_{11}$ and $Q_{12}$ are connected respectively to the collectors of NPN transistors $Q_4$ and $Q_5$. The bases of the transistors receive a bias voltage $V_B$ from a bias source 122 and the collectors thereof are connected to a power supply terminal 123 receiving a positive voltage $+V$. The emitters of the transistors $Q_4$ and $Q_5$ are grounded via resistors $R_3$ and $R_4$ and the bases thereof are connected in common to the base of an NPN transistor $Q_1$. The emitter of the transistor $Q_1$ is grounded via a resistor $R_1$ and the collector thereof is connected to a current source 121 generating a reference current $I_{ref}$. The collector of $Q_1$ is also connected to its base via a baseemitter path of an NPN transistor $Q_2$ having its collector connected to the terminal 123. Accordingly, the transistors $Q_1$, $Q_2$, $Q_4$ and $Q_5$ constitutes a current mirror circuit, so that the transistors $Q_4$ and $Q_5$ produces their collector current relative to the reference current $I_{ref}$. In this embodiment, the resistors $R_1$, $R_3$ and $R_4$ are designed to take the same resistance value and the transistors $Q_1$, $Q_4$ and $Q_5$ have the same emitter area. Therefore, the collector currents of the transistors $Q_4$ and $Q_5$ are substantially equal to the reference current $I_{ref}$ and thus denoted by "$I_{ref}$".

When the comparison output $V_1$ is larger in voltage than the bias voltage $V_B$, the transistors $Q_9$ and $Q_{10}$ are turned OFF and ON, respectively. At this time, the collector current $I_{ref}$ of the transistor $Q_4$ is equal to the emitter current of the transistor $Q_{10}$ that is equal to the sum of its base and collector currents. Accordingly, the base and collector currents $I_B$ and $I_C$ of the transistor $Q_{10}$ take values of $I_{ref}/h_{FE}$ and $(I_{ref}-I_B)$, respectively, where $h_{FE}$ represents a current gain of the transistor $Q_{10}$. Since the CP 12 is fabricated as a semiconductor integrated circuit device, all NPN transistors are matched with one another and thus take the substantially same current gain $h_{FE}$. All PNP transistors are also matched with one another. Similarly, when the comparison output $V_2$ is larger in voltage than the bias voltage $V_B$ to turn the transistor $Q_{12}$ ON, the base and collector currents of $Q_{12}$ take values of $I_{ref}/h_{FE}$ and $(I_{ref}-I_B)$, respectively.

An NPN transistor $Q_3$ has it base connected to the base of the transistor $Q_1$ and its emitter grounded via a resistor $R_2$. The emitter area of the transistor $Q_3$ is equal to that of $Q_1$, and the resistor $R_2$ is equal to the resistor $R_1$. Therefore, the collector current of $Q_3$ is substantially equal to the reference current $I_{ref}$, and thus denoted by "$I_{ref}$". The collector of the transistor $Q_3$ is connected to the collector of a PNP transistor $Q_6$ and to the base of a PNP transistor $Q_7$. The emitter of the transistor $Q_6$ is connected via a resistor $R_5$ to the terminal 123 and the base thereof is connected to the collector of $Q_7$ and to the base of a PNP transistor $Q_8$. The collector of the transistor $Q_7$ is grounded. The emitter of the transistor $Q_8$ is connected via a resistor $R_6$ to the terminal 123 and the collector thereof is connected to the output terminal 124. The transistors $Q_6$ to $Q_8$ and the resistors $R_5$ and $R_6$ constitute a current mirror circuit. The sizes of $Q_6$ to $Q_8$ are the same and the resistance values of $R_5$ and $R_6$ are equal to each other.

Two NPN transistors $Q_{13}$ and $Q_{14}$ and a resistor $R_7$ are provided as a base current compensation circuit in accordance with the present invention. The transistor $Q_{13}$ has the same emitter area as the transistor $Q_1$ and its base connected to the base of $Q_1$. The resistor $R_7$ has the same resistance value as the resistor $R_1$ and is connected between the emitter of $Q_{13}$ and the ground. Therefore, the collector current of the transistor $Q_{13}$ is made substantially equal to the reference current $I_{ref}$, and thus denoted by "$I_{ref}$". The collector of $Q_{13}$ is connected to the emitter of the transistor $Q_{14}$ whose collector is connected to the terminal 123. The base of $Q_{14}$ is connected to the emitter of the transistor $Q_8$. As already mentioned above, the current gains of the transistors $Q_{10}$, $Q_{12}$ and $Q_{14}$ are equal to one another. Therefore, a current having a value of $I_{ref}/h_{FE}$ is supplied from the terminal 23 via the resistor $R_6$ to the transistor $Q_{14}$ as a base current $I_B$. In other words, a part of a current that is to flow through the transistor $Q_4$ flows into the transistor $Q_{14}$. As a result, the collector current of the transistor $Q_8$ takes a value that is smaller than the reference current $I_{ref}$ by the base current $I_B$. This value is thus represented by $(I_{ref}-I_B)$.

Figure 3A:
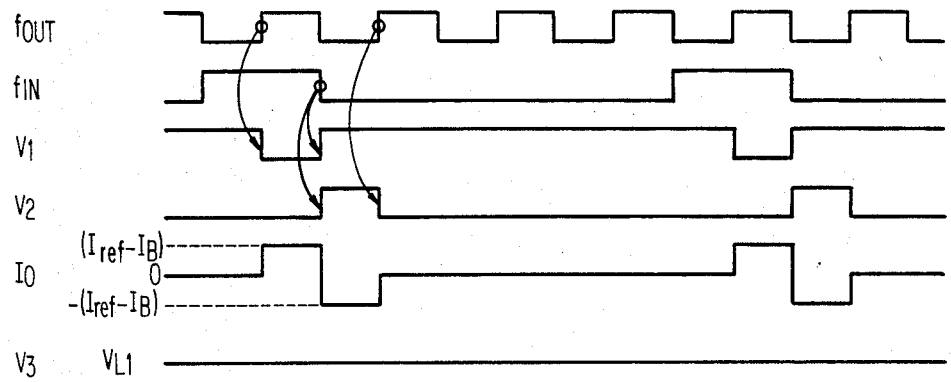
FIGS. 3A to 3C are timing charts for explaining an operation of the circuit shown in FIG. 2.
Figure 3B:
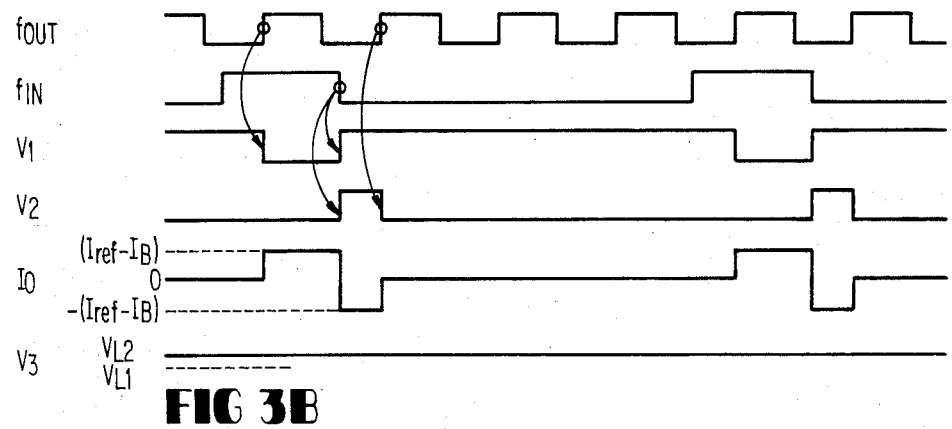
Figure 3C:
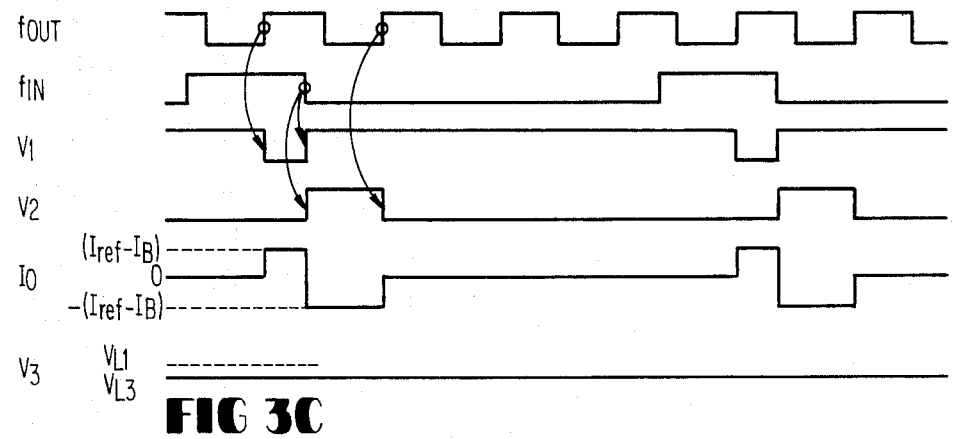

Referring to FIGS. 3A to 3C, a circuit operation of FIG. 2 will be described below. There are three relationships between phases of the oscillation signal $f_{OUT}$ and the input signal $f_{IN}$. The first relationship is that the phase of the oscillation signal $f_{OUT}$ is coincident with that of the input signal $f_{IN}$ as shown in FIG. 3A. The PC 11 inverts the first comparison output $V_1$ from a high level to a low level in synchronism with the leading edge of the oscillation signal $f_{OUT}$ that appears during a high level period of time of the input signal. The first comparison output $V_1$ is returned to the high level in synchronism with the falling edge of the input signal $f_{IN}$. At this time, the PC 11 inverts the second comparison output $V_2$ from the low level to the high level. The output $V_2$ is returned to the low level in synchronism with the leading edge of the oscillation signal $f_{OUT}$ that appears within a low level period of time of the input signal $f_{IN}$. As a result, a low level period of time of the first output $V_1$ and a high level period of time of the second output $V_2$ are made equal to each other in the first phase relationship, as shown in FIG. 3A.

When the first and second output $V_1$ and $V_2$ take the high level and the low level, respectively, the transistor $Q_{10}$ is turned ON and the transistor $Q_{12}$ is turned OFF. Only the transistor $Q_{10}$ produces its collector current of $(I_{ref}-I_B)$ level. The transistor $Q_8$ also produces its collector current of $(I_{ref}-I_B)$ level. Accordingly, an output current $I_O$ supplied via the output terminal 124 to the LPF 13 takes a zero level as shown in FIG. 3A. In other words, the LPF 13 is disconnected from the terminal 124 with respect to current.

When both of the outputs $V_1$ and $V_2$ take the low level to turn both of the transistors $Q_{10}$ and $Q_{12}$ OFF, the collector current of the transistor $Q_8$ is supplied via the output terminal 124 to the LPF 13. That is, the LPF 13 is charged by a current having a value of $(I_{ref}-I_B)$ as shown in FIG. 3A.

When both of the outputs $V_1$ and $V_2$ take the high level, both of the transistors $Q_{10}$ and $Q_{12}$ produce the collector current of $(I_{ref}-I_B)$ level. Since the collector current of the transistor $Q_{10}$ is counteracted by the collector current of the transistor $Q_8$, the transistor $Q_{12}$ draws the $(I_{ref}-I_B)$ level current from the LPF 13 via the output terminal 124. In other words, the current having a value of $-(I_{ref}-I_B)$ is supplied to the LPF 13 to discharge it, as shown in FIG. 3A.

Since the charging and discharge periods of time are equal to each other, the output $V_3$ of the LPF takes a first level represented by "$V_{L1}$" in FIG. 3A to maintain the first phase relationship between the oscillation signal $f_{OUT}$ and the input signal $f_{IN}$.

The second phase relationship is that the phase of the oscillation signal $f_{OUT}$ delays as shown in FIG. 3B. In this case, the charging period of time of the LPF 13 is made longer than the discharging period of time thereof, as apparent from the outputs $V_1$ and $V_2$ shown in FIG. 3B. The output $V_3$ of the LPF 13 thus takes a second level denoted by "$V_{L2}$" in FIG. 3B and larger than the first level $V_{L1}$. The oscillator 10 is thereby controlled so that the phase of the oscillation signal $f_{OUT}$ is advanced by the second level output $V_3$.

The third phase relationship is that the phase of the oscillation signal $f_{OUT}$ advances as shown in FIG. 3C. The discharging period of time of the LPF 13 is therefore made longer than the charging period of time. The output $V_3$ of the LPF 13 is thereby changed to a third level represented by "$V_{L3}$" in FIG. 3B and smaller than the first level $V_{L1}$. As a result, the phase of the oscillation signal $f_{OUT}$ is made coincident with that of the input signal $f_{IN}$.

Figure 4:
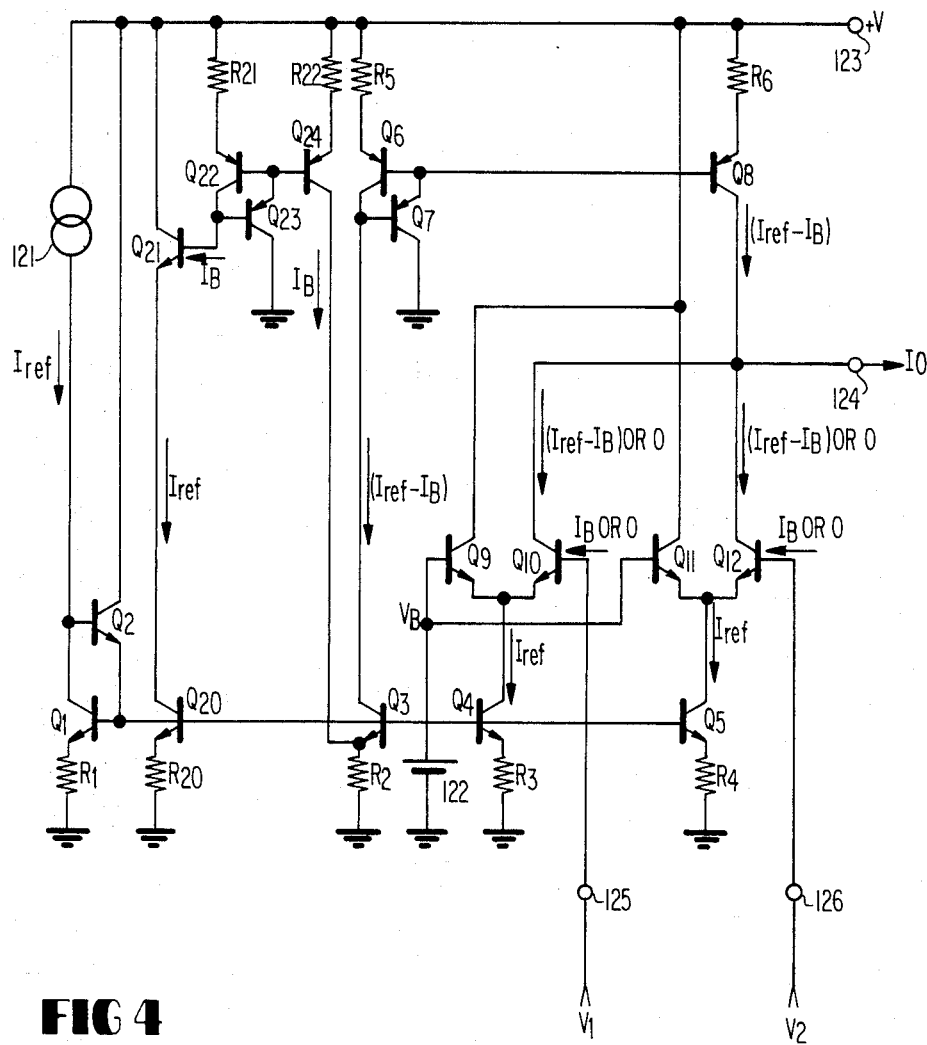
FIG. 4 is a circuit diagram showing still another embodiment of the present invention.

Referring to FIG. 4, still another embodiment of the present invention will be described, wherein the same constitutents as those in FIG. 2 are denoted by the same reference numerals and symbols to omit their further explanation and only the charge pump circuit is shown.

In FIG. 4, the base current compensation circuit is composed of two NPN transistors $Q_{20}$ and $Q_{21}$, three PNP transistors $Q_{22}$ to $Q_{24}$ and three resistors $R_{20}$ to $R_{22}$. The transistor $Q_{20}$ has its base connected to the base of the transistor $Q_1$ and its emitter grounded via the resistor $R_{20}$ and the emitter area thereof is equal to that of the transistor $Q_{20}$. The resistor $R_{20}$ has the same resistance value as the resistor $R_1$. Therefore, the transistor $Q_{20}$ produce its collector current that is substantially equal to the reference current $I_{ref}$. The transistor $Q_{21}$ has its emitter connected to the collector of $Q_{20}$ and its collector connected to the terminal 123. Accordingly, the base current of the transistor $Q_{21}$ takes a value of $I_{ref}/h_{FE}$, and thus denoted by "$I_B$". The transistors $Q_{22}$ to $Q_{24}$ and the resistors $R_{21}$ and $R_{22}$ constitute a current mirror circuit receiving the base current $I_B$ of the transistor $Q_{21}$ as its input current. The current gain of this current mirror circuit, i.e. the ratio of the output current to the input current, is designed to be 1. As a result, the collector current of the transistor $Q_{24}$ has a value that is substantially equal to the base current of $Q_{21}$, and thus denoted by "$I_B$". The collector of the transistor $Q_{24}$ is connected to the emitter of the transistor $Q_3$ to supply the base current $I_B$ to the resistor $R_2$. Accordingly, the transistor $Q_3$ produces its collector current having a value of $(I_{ref}-I_B)$. This collector current is produced as an input current to the current mirror circuit composed of the transistors $Q_6$ to $Q_8$ and the resistors $R_5$ and $R_6$. As a result, also in this embodiment, the transistor $Q_8$ produces the $(I_{ref}-I_B)$ level current.

The present invention is not limited to the above-described embodiments, but can be modified and changed without departing from the scope and spirit of the present invention.

What is claimed is:

1. A current output circuit comprising a plurality of input terminals receiving a plurality of input voltage signals, respectively, a reference current source generating a reference current, a plurality of first current-producing means coupled to said reference current source each for producing a first current having a first amplitude, an output terminal outputting an output current of a polarity determined by said input voltage signals, a plurality of switching means coupled between said first current-producing means and said output terminal, respectively, and having control terminals coupled to said input terminals, respectively, for switching paths of said first current therebetween in response to said input voltage signals at their control terminals, respectively, to supply to said output terminal an output current of a first polarity having one or more integer times of an amplitude which is said first amplitude of said first current minus a second amplitude of a current spended by one of said switching means, a second currentproducing means coupled to said reference current source for producing a second current having said first amplitude, a third current-producing means coupled to said reference current source for producing a third current having said second amplitude, and means coupled to said second and third current-producing means and to said output terminal for substracting said third current from said second current to supply to said output terminal an output current of a second polarity having an amplitude which is said first amplitude of said second current minus said second amplitude of said third current.

2. The circuit as claimed in claim 1, wherein each of said switching means includes a first transistor having a base coupled to each of said input terminals, an emitter coupled to said each of said first current-producing means and a collector coupled to said output terminal.

3. The circuit as claimed in claim 2, wherein said third current-producing means includes a second transistor having an emitter supplied with said reference current, a base and a collector, said third current being produced as a base current of said second transistor.

4. The circuit as claimed in claim 1, wherein each of said first and second current-producing means comprises a current mirror circuit.

5. A current output circuit comprising a plurality of input terminals receiving input signals, a first current mirror circuit having its input end supplied with a first reference current and producing at its first and second output ends first and second currents each having a first value, an output terminal, a plurality of first transistors each having a base coupled to each of said input terminals and a collector-emitter current path connected between said output terminal and each first output end of said first current mirror circuit, a second transistor of the same conductivity type as said first transistor having a base, an emitter connected to the second output end of said first current mirror circuit and a collector connected to a potential point, a second current mirror circuit having its input end supplied with a second reference current and its control end connected to the base of said second transistor to receive a base current of said second transistor and producing at its output end a third current having a second value that is smaller than said first value by said base current of said second transistor, and means for connecting the output end of said second current mirror circuit to said output terminal.

6. The circuit as claimed in claim 5, wherein each of said first and second reference currents has said first value.

7. A transistor circuit comprising first, second and third current sources each producing a reference current having a predetermined value, a first input terminal supplied operatively with a first control signal, a second input terminal supplied operatively with a second control signal, a first transistor of one conductivity type having its emitter connected to said first current source, its collector connected to said output terminal and its base connected to said first input terminal, a second transistor of said one conductivity type having its emitter connected to said second current source, its collector connected to said output terminal and its base connected to said second input terminal, a power supply terminal, a third transistor of an opposite conductivity type having its emitter coupled to said power supply terminal, its collector connected to said third current source and its base, means for connecting the base of said third transistor to the collector thereof, a fourth transistor of said opposite conductivity type having its emitter coupled to said power supply terminal, its collector connected to said output terminal and its base connected to the base of said third transistor, and a base current compensation circuit including a fourth current source producing a current having said predetermined value and a fifth transistor of said one conductivity type having its emitter connected to said fourth current source, its collector coupled to said power supply terminal and its base connected to the emitter of said fourth transistor.

8. The transistor circuit as claimed in claim 7, further comprising a sixth transistor of said one conductivity type having its emitter connected to the emitter of said first transistor, its collector connected to said power supply terminal and its base supplied with a bias voltage and a seventh transistor of said one conductivity type having its emitter connected to the emitter of said second transistor, its collector connected to said power supply terminal and its base supplied with said bias voltage.

9. A transistor circuit comprising a first input terminal supplied operatively with a first switching control signal, a second input terminal supplied operatively with a second switching control signal, an output terminal, first, second and third current sources each producing a reference current, a first transistor having its base connected to said first input terminal, its emitter connected to said first current source and its collector connected to said output terminal, a second transistor of the same conductivity type as said first transistor having its base connected to said second input terminal, its emitter connected to said second current source and its collector connected to said output terminal, a third transistor of the same conductivity type as said first transistor having its emitter connected to said third current source, its collector connected to a potential point and its base, a first current mirror circuit having its input end connected to the base of said third transistor to receive a base current thereof and producing at its output end a compensation current that is substantially equal to said base current of said third transistor, a fourth transistor having its base supplied with a bias voltage and its emitter connected to the output end of said first current mirror circuit and to a reference point through impedance means and producing at its collector a collector current that is smaller than said reference current by said compensation current, a second current mirror circuit having its input end connected to the collector of said fourth transistor and producing its output end an output current that is substantially equal to said collector current, and means for connecting the output end of said second current mirror circuit to said output terminal.

10. A phase locked oscillator comprising a frequency variable oscillator generating an oscillation signal, a phase comparator comparing a phase of said oscillation signal with that of an input signal and producing first and second comparison outputs, a low-pass filter, a charge pump circuit charging or discharging said low-pass filter in response to said first and second comparison outputs, and means for feeding back an output of said low-pass filter to said frequency variable oscillator to control the phase of said oscillation signal, said charge pump circuit including first and second current sources each producing a first reference current, an output terminal connected to said low-pass filter, a first transistor having its base supplied with said first comparison output and its collector-emitter current path connected between said output terminal and said first current source, a second transistor having its base supplied with said second comparison output and its collector-emitter current path connected between said output terminal and said second current source, and a third current source connected to said output terminal and producing a second reference current that is smaller than said first reference current by a base current of said first transistor.

* * * * *